(12) United States Patent
Tanaka

(10) Patent No.: US 6,524,946 B1
(45) Date of Patent: Feb. 25, 2003

(54) METHOD OF FABRICATING A SEMICONDUCTOR DEVICE HAVING A CONTACT HOLE

(75) Inventor: Satoshi Tanaka, Tokyo (JP)

(73) Assignee: Oki Electric Industry Co., Ltd., Tokyo (JP)

( * ) Notice: Subject to any disclaimer, the term of this patent is extended or adjusted under 35 U.S.C. 154(b) by 0 days.

(21) Appl. No.: 09/657,979

(22) Filed: Sep. 8, 2000

(30) Foreign Application Priority Data

Sep. 10, 1999 (JP) .......................................... 11/257208

(51) Int. Cl.[7] .......................................... H01L 21/4763
(52) U.S. Cl. ...................... 438/637; 438/626; 438/634; 438/648; 438/656; 438/680; 438/685; 438/686; 438/688; 438/694; 438/699
(58) Field of Search ................................ 438/241, 253, 438/254, 396, 397, 645, 648, 656, 626, 637, 694, 680, 685, 686, 688; 257/634

(56) References Cited

U.S. PATENT DOCUMENTS

| | | | |
|---|---|---|---|
| 4,944,884 A | | 7/1990 | Beyer et al. |
| 5,246,884 A | | 9/1993 | Jaso et al. |
| 5,387,539 A | | 2/1995 | Yang et al. |
| 5,532,191 A | * | 7/1996 | Nakano et al. .............. 437/228 |
| 5,885,587 A | * | 3/1999 | Yamaha et al. .............. 438/129 |
| 5,892,269 A | * | 4/1999 | Inoue et al. ................. 257/634 |
| 5,998,251 A | * | 12/1999 | Wu et al. .................... 438/241 |
| 6,046,084 A | * | 4/2000 | Wei et al. .................... 438/255 |
| 6,060,385 A | * | 5/2000 | Givens ......................... 438/626 |
| 6,171,954 B1 | * | 1/2001 | Hsu ............................. 438/656 |

* cited by examiner

*Primary Examiner*—David Nelms
*Assistant Examiner*—Reneé R. Berry
(74) *Attorney, Agent, or Firm*—Volentine Francos, PLLC

(57) ABSTRACT

An insulating film for embedding conductive portions therein is formed so as to represent convex configurations corresponding to each top of convex conductive portions. The insulating film is covered with an etching stopper film having an etching rate which is smaller than that of the insulating film. Convex portions of the etching stopper film corresponding to each top of the conductive portions are removed partially, thereby forming a contact hole that reaches each top of the conductive portions through the removal portions of the silicon nitride film by an etching treatment. A plug conductive portion connected to each top of the conductive portions is formed in the contact hole.

9 Claims, 2 Drawing Sheets

METHOD OF FABRICATING A SEMICONDUCTOR DEVICE HAVING A CONTACT HOLE

BACKGROUND OF THE INVENTION

1. Field of the Invention

The invention relates to a method of fabricating a semiconductor device having a contact hole, particularly to a method of forming a via hole best suited to a multilayer interconnection structure.

2. Description of the Related Art

There is a multilayer interconnection technique as a technique capable of increasing degree of integration of a semiconductor device. According to the multilayer interconnection technique, an insulating film is formed on a wiring portion on the semiconductor substrate. If the surface of this insulating film is made flat, an etching mask for providing a via hole is formed on the flattened insulating film by a photolithographic process. A selective etching treatment is applied to the insulating film through the etching mask so as to provide a contact hole which reaches the top of the wiring portion positioned under the insulating film. A plug wiring portion is formed in this contact hole, namely, via hole so as to be filled with a conductive material. After the plug wiring portion to be embedded in the via hole is formed, an upper layer interconnection portion connected to the wiring portion serving as a lower wiring portion under the insulating film through the plug wiring portion is formed on the insulating film, thereby realizing a multilayer interconnection structure.

Meanwhile, it is preferable that the diameter of the via hole is set to be large in a manner that the diameter of the plug wiring portion to be connected to the wiring portion under the insulating film substantially conforms to the width dimension or measurement of the wiring portion so as to reduce a wiring resistance.

However, if the opening diameter of the contact hole serving as the via hole is merely increased to conform to the width dimension of the wiring portion, there is a fear of arising a problem that the contact hole or via hole does not accurately reach the top of the lower layer interconnection portion even if there occurs a slight deviation of the location of the etching mask for providing the contact hole from a given position in the photolithographic process, so that the contact hole is open to the other circuit parts at the side of the lower layer interconnection portion.

If the plug wiring portion is formed in the via hole which is deviated from a given position, the plug wiring portion formed in the via hole reaches other circuit parts at the side of the lower wiring portion, entailing an accidental trouble such as a short circuit in the circuits, or unwanted increase of capacitance.

Accordingly, it has been desired so far a method of fabricating a via hole to reduce a wiring resistance without bringing about accidental trouble owing to a tolerance in a photolithographic process.

SUMMARY OF THE INVENTION

To solve the foregoing problems, the invention has the following structure.

A method of fabricating a semiconductor device comprising a semiconductor substrate, an insulating film provided on the semiconductor substrate for embedding therein conductive portions each having a convex configuration, and a contact hole provided in the insulating film and reaching the conductive portions, said method is characterized in further comprising the steps of forming the insulating film for embedding the conductive portions therein so as to represent a convex configuration corresponding to each top of the convex conductive portions, forming an etching stopper film along a surface configuration of the insulating film for covering the insulating film thereby, an etching rate of the etching stopper film being smaller than that of the insulating film, partially removing convex portions of the etching stopper film corresponding to each top of the convex conductive portions, and forming a contact hole by an etching treatment, said contact hole reaching each tops of the convex conductive portions through the removal portion of the etching stopper film.

According to the invention, since the etching stopper film formed under an etching mask is formed on the insulating film along a surface configuration of the insulating film which rises in the portion corresponding to the top of the convex conductive portion to which a contact hole serving as a via hole is open, for example, if the surface of the etching stopper film is removed along the flat surface, only the portion corresponding to each top of the convex conductive portion can be partly removed comparatively precisely.

Accordingly, even if the etching mask is formed at the portion deviated from, for example, a given position, in the selective etching treatment using this etching mask, the etching stopper film to which only the portion corresponding to each top of the convex conductive portions is open comparatively precisely serves as an auxiliary mask operation, thereby preventing the contact hole from being open to the portion deviated from the convex conductive portions.

The insulating film for embedding the convex conductive portions therein can be formed of an silicon oxide film, and the silicon oxide film is formed by a plasma tetraethoxysilane (TEOS) process so that the insulating film having a convex portion corresponding to each top of the convex conductive portions can be suitably formed.

The silicon oxide film for embedding the convex conductive portion therein can be formed by a bias chemical vapor deposition (CVD) process instead of the plasma TEOS process. It is possible to suitably form the insulating film having the convex portion corresponding to the fine convex conductive portion by the employment of the bias CVD process.

As the etching treatment of the insulating film formed of the silicon oxide film, a dry etching including a reaction gas such as fluorine can be employed wherein a silicon nitride film representing the etching rate which is smaller than the silicon oxide film relative to the etching gas can be used as the etching stopper film.

An etchant such as an etching gas or an etching liquid and a material of the etching stopper film can be appropriately selected depending on the kind and characteristic of the insulting film.

It is preferable that the partial removal of the etching stopper film is effected by chemical mechanical polishing (hereinafter referred to as CMP).

Further, the invention is suitable for fabricating a multilayer interconnection structure wherein an interlayer insulating film between the upper layer interconnection portion and a lower layer interconnection portion forms an insulating film.

DETAILED DESCRIPTION OF THE PREFERRED EMBODIMENTS

First and second embodiments of the invention applied to a multilayer interconnection structure of a semiconductor integrated circuit is now described with reference to the attached drawings.

[First Embodiment: FIGS. 1A to 1E]

Figure 1A:
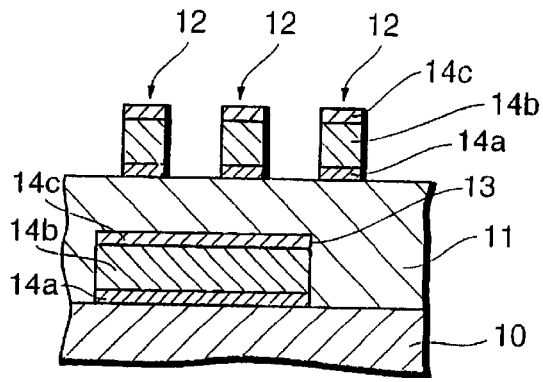
FIGS. 1A to 1E are sectional views schematically showing a method of fabricating a via hole according to a first embodiment of the invention, and showing processes in a case where a plasma TEOS oxide film is formed on a lower layer interconnection portion.

FIGS. 1A to 1E show schematically a method of fabricating a semiconductor integrated circuit according to a first embodiment of the invention. In the multilayer interconnection structure of the invention, interconnection patterns 12 are formed on an insulating film 11 made of such as a silicon oxide so as to cover, for example, a silicon semiconductor substrate 10 as shown in FIG. 1A, using a conventionally well-known photolithographic and etching technique.

MOS transistor or other circuit elements (not shown) are integrated into the semiconductor substrate 10 as well known in the conventional semiconductor integrated circuit, wherein a lower inter wiring pattern 13 serving as a circuit wiring or interconnection is formed and the insulating film 11 serving as an interlayer insulating film is formed so as to embed the foregoing elements therein.

In FIGS. 1B to 1E, the semiconductor substrate 10 and the wiring pattern 13 shown in FIG. 1A are omitted in illustration in view of the simplification of the drawing.

Respective interconnection patterns 12 and 13 are formed of conductive portions (12 and 13) each having a well known lamination structure which is excellent in electromigration characteristics and comprising titanium layers 14a, aluminum layers 14b and titanium nitride layers 14c.

As well known conventionally, the titanium layer 14a has a high melting point, and it enables crystals of the aluminum layer 14b to grow on the titanium layer 14a so as to enlarge grain size of crystals on the aluminum layer 14b so that the occurrence of electromigration is suppressed at the grain boundary of the aluminum layer 14b. Further, the titanium nitride layer 14c is an antireflective film which is well known conventionally and provided for improving the accuracy of patterning of respective interconnection patterns 12 and 13, and the titanium nitride layer 14c operates to prevent light radiated on the aluminum layer 14b from being reflected from the aluminum layer 14b in a photolithographic process for patterning the respective interconnection patterns 12 and 13.

A new interlayer insulating film 15 (composed of upper layer portion 15a, intermediate layer 15b and lower layer portion 15c) is formed on the semiconductor substrate 10, namely, on the flat plain surface of the insulating film 11 as shown in FIGS. 1B to 1E in order to cover the interconnection patterns 12 serving as convex conductive portions so as to form a new upper layer interconnection pattern, that is electrically connected to a given portion of the interconnection patterns, on the interconnection patterns 12 over the insulating film 11 for embedding the wiring pattern 13 therein.

The interlayer insulating film 15 comprises, as shown in FIGS. 1B to 1E, the upper layer portion 15a and the lower layer portion 15c each made of a P-TEOS silicon oxide film, for example, by a plasma TEOS process that is suitable for preventing the interconnection patterns 12 from being degraded, as well known conventionally, and the intermediate layer 15b provided between the upper layer portion 15a (hereinafter referred to as silicon oxide upper film) and lower layer portion 15c (hereinafter referred to as silicon oxide lower film) and made of an $O_3$-TEOS silicon oxide film, for example, by an ozone TEOS process that is excellent in fluidity.

Figure 1B:
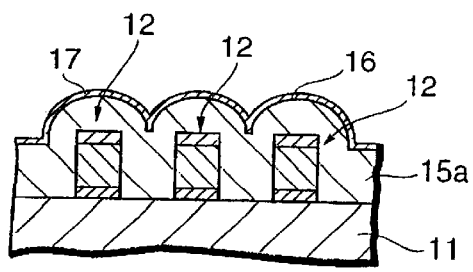

When the interconnection patterns 12 are formed on the insulating film 11, the silicon oxide lower film 15a that is suitable for protecting the interconnection patterns 12 from degradation in moisture content is formed by a plasma TEOS process, as shown in FIG. 1B. According to the plasma TEOS process, an upper surface 16 having a configuration to protrude in a hemisphere at the portions where the interconnection patterns or conductive portion s12 are positioned is formed as shown in a cross section of FIG. 1B, corresponding to respective convex conductive portions 12 that are formed in given intervals on the flat surface of the insulating film 11, namely, corresponding to the convex configuration of the conductive portions 12.

A silicon nitride film 17 made of, for example, $SI_3N_4$ is formed, as shown in FIG. 1B, for example, by a pressure reduction CVD process, on the upper surface 16 of the silicon oxide lower film 15a showing the configuration corresponding to the convex configuration of the conductive portions 12 so as to cover the upper surface 16.

The silicon nitride film 17 is different from the interlayer insulating film 15 including the silicon oxide lower film 15a in etching resistance property.

Figure 1C:
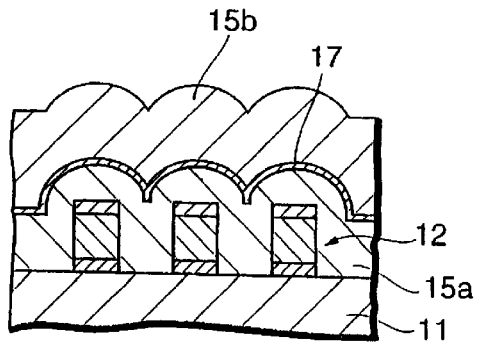

The intermediate layer 15b comprising a $O_3$TEOS silicon oxide film is formed as a sacrifice film, as shown in FIG. 1C, on the silicon nitride film 17 that is formed on the upper surface 16 of the silicon oxide lower film 15a by an ozone TEOS process. Since the intermediate layer 15b made of the $O_3$TEOS silicon oxide film shows a high fluidity compared with the silicon oxide lower film 15a formed by the plasma TEOS process, it has an upper surface excellent in flatness compared with the silicon oxide lower film 15a.

After the intermediate layer 15b is formed, the intermediate layer, namely, sacrifice film 15b is subjected, e.g., to chemical mechanical polishing (CMP). The upper surface of the sacrifice film 15b is sequentially removed by the CMP to keep the flat surface.

The upper surface 16 of the silicon oxide lower film 15a on which the silicon nitride film 17 is formed reproduces convex configurations in accurate positions corresponding to the convex configurations of each top of each conductive portions 12, and the silicon nitride film 17 is formed on the upper surface 16 corresponding accurately to the convex configurations of the conductive portions 12.

Figure 1D:
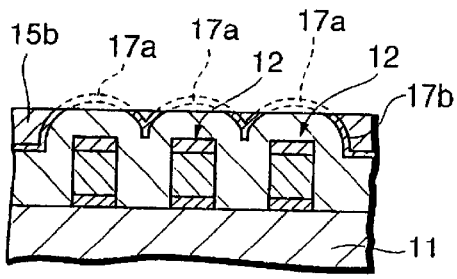

Accordingly, as the result of the foregoing CMP, convex portions 17a of the silicon nitride film 17 positioned over each top of the conductive portion s12 in correspondence with each conductive portion 12 is accurately removed along the convex configuration corresponding to each top of the conductive portions 12 as shown in FIG. 1D, so that the portions 17b including the portion covering the upper portion of the both edges of the conductive portions 12 remains.

Figure 1E:
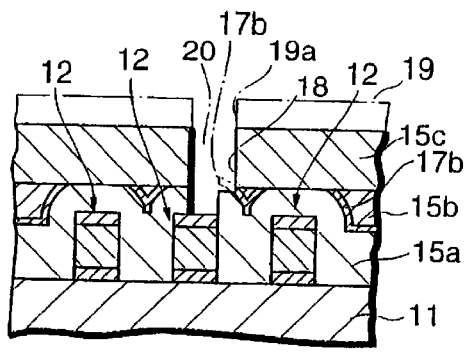

The silicon oxide upper film 15c is formed, as shown in FIG. 1E, on the flat upper surface of the residual sacrifice film 15b like the silicon oxide lower film 15a, for example, by a plasma TEOS process in the same manner.

Since the silicon oxide upper film 15c forming the upper layer of the interlayer insulating film 15 is formed on the sacrifice film 15b which was subjected to the CMP, it has a flat upper surface.

In the first embodiment shown in FIGS. 1A to 1E, although an upper interconnection pattern (not shown) is formed on the interlayer insulating film 15 having a three-layered interconnection structure including the silicon oxide upper film 15c, i.e., on the silicon oxide upper film 15c having a flat surface, a contact hole 18 serving as a so-called via hole for connecting between the upper interconnection pattern and the conductive portions 12 inside the interlayer insulating film 15 serving as the lower layer thereof before the upper layer interconnection pattern is formed.

A resist 19 having an opening 19a corresponding to the contact hole 18 is formed as shown in FIG. 1E so as to form the contact hole 18 using a photolithographic technique that is well known conventionally.

For example, a dry etching treatment is applied to the interlayer insulating film 15 from the upper surface of the resist 19 while the resist 19 serves as a mask for a selective etching treatment. It is possible to use an etching gas including a reaction gas such as fluorine that is well known conventionally as a gas for a dry etching treatment.

Since an etching rate of the etching gas relative to the silicon nitride film 17 is smaller than that relative to the interlayer insulating film 15, the silicon nitride film 17 operates as an etching stopper film.

The foregoing etching treatment may be substituted by a wet etching treatment instead of a dry etching treatment, if need be.

In the selective etching treatment using the resist 19, the silicon nitride film 17 that operates as an etching stopper film relative to an etching gas is provided inside the interlayer insulating film 15 to which the etching treatment is applied under the resist 19, and convex portions 17a accurately corresponding to each top of the conductive portions 12 are polished by the CMP and removed.

Accordingly, in the foregoing etching treatment, the removal portion of the silicon oxide lower film 15a under the silicon nitride film 17, i.e., the portion corresponding to the convex portions 17a is not impaired by the foregoing etching treatment. However, the residual portions 17b excluding the removal convex portions 17a of the silicon nitride film 17 protects the silicon oxide lower film 15a positioned thereunder from the etching treatment with reliability.

Accordingly, even if the opening 19a is deviated from a given position in a photolithographic process of the resist 19 to cause an application of an etching treatment to the sides of the conductive portion s12 serving as the wiring pattern in the interlayer insulating film 15, the etching treatment is applied to the residual portions 17b per se during a given etching treating time so that the silicon oxide lower film 15a positioned under the residual portions 17b can be protected with reliability. As a result, it is possible to prevent the contact hole 18 from reaching the insulating film 11 at the side of each conductive portion 12.

After the via hole is formed of the contact hole 18, a plug conductive portion to be embedded in the via hole is formed, and a wiring pattern that is the same as the foregoing one and connected to the conductive portions 12 through the plug conductive portion 20 is formed on the interlayer insulating film 15, namely, on the silicon oxide upper film 15c.

In the method of the first embodiment, the contact hole 18 where the plug conductive portion 20 is formed is surely prevented from being protruded from the conductive portions 12 by the residdual portions 17b of the silicon nitride film 17 inside the interlayer insulating film 15. Accordingly, even if the width dimension of the plug conductive portion 20 is equal to that of the conductive portions 12 so as to reduce the resistance of the conductive portion 20, namely, a borderless wiring is tried, it is possible to prevent the plug conductive portion from reaching the side of the conductive portions 12 inadvertently or an wiring pattern 13 under the conductive portions 12 (see FIG. 1A) regardless of the presence or absence of error in disposition of the resist 19, thereby surely preventing an accidental trouble such as a short circuit in the circuits, or unwanted increase of capacitance.

The first embodiment explained a case where silicon oxide lower film 15a in which the silicon nitride film 17 forming the stopper film is formed by a plasma TEOS process.

According to the plasma TEOS process, it can sufficiently adapted to a design rule of exceeding 0.5 $\mu$m as an interval between the conductive portions 12 but it is difficult to apply to a design rule of not more than 0.5 mm as the interval between the conductive portions transparent substrates (1, 2) for obtaining an appropriate convex configuration corresponding to each conductive portion 12 on the upper surface 16 of the silicon oxide lower film 15a.

Accordingly, a method adapted for finer design rule is now described with reference to a second embodiment of the invention.

[Second Embodiment: FIGS. 2A to 2D]

FIGS. 2A to 2E show schematically a method of fabricating a semiconductor integrated circuit according to a second embodiment of the invention. In FIGS. 2A to 2D, a semiconductor substrate 10 and a wiring pattern 13 are omitted in illustration in view of the simplification of the drawing in the same manner as FIGS. 1B to 1E.

Figure 2A:
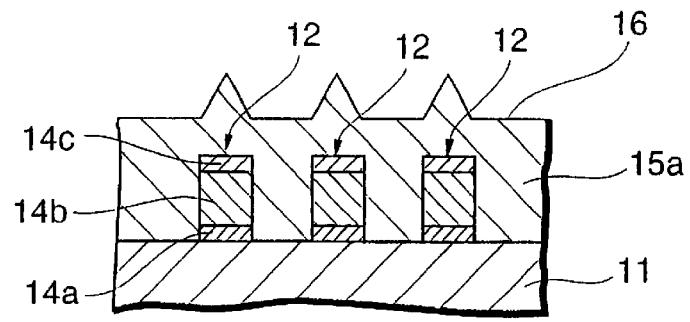
FIGS. 2A to 2D are sectional views schematically showing a method of fabricating a via hole according to a second embodiment of the invention, and showing processes in a case where a bias CVD oxide film is formed on a lower layer interconnection portion.

In the second embodiment shown in FIG. 2A, there is provided a silicon oxide lower film 15a for embedding therein conductive portions 12 composed of a titanium layer 14a, an aluminum layer 14b and a titanium nitride layer 14c in the same manner as shown in FIG. 1A.

In the second embodiment, the silicon oxide lower film 15a for embedding the conductive portions 12 therein is formed by a conventionally well known bias CVD process.

In the bias CVD process, deposition of silicon oxide serving as a material constituting the silicon oxide lower film 15a and a sputtering/etching treatment of the deposited silicon oxide are effected at the same time, whereby triangular convex portions each having an apex rising upward are formed on the portions corresponding to the tops of the conductive portions 12 as shown in FIG. 2A.

Accordingly, when the silicon oxide lower film 15a is formed using the foregoing bias CVD process, the convex portions can be suitably formed on the upper surface 16 of the silicon oxide lower film 15a corresponding to the conductive portions 12 even in a fine design rule of not more than 0.5 $\mu$m.

Figure 2B:
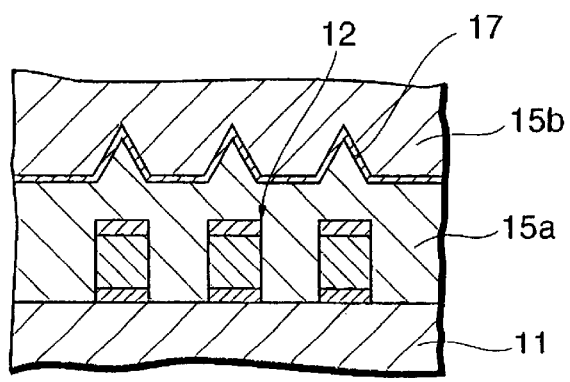

A silicon nitride film 17 is formed on the upper surface 16 of the silicon oxide lower film 15a representing triangular convex portions as shown in FIG. 2B in the same manner as the first embodiment, and a sacrifice film 15b serving as the intermediate layer portion for covering the silicon nitride film is also formed on the upper surface 16.

After the sacrifice film 15b is formed, the sacrifice film 15b is subjected to the CMP in the same manner as the first embodiment. With the CMP, the upper surface of the sacrifice film 15b is sequentially removed so as to keep the flat surface.

Figure 2C:
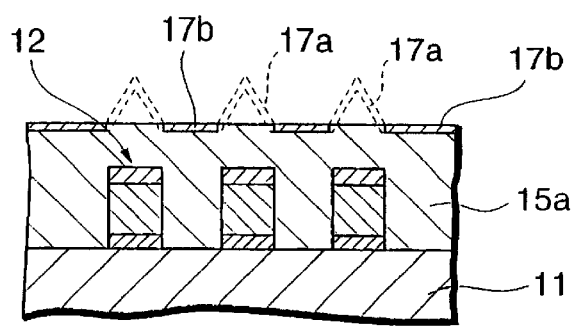

As a result of the CMP, convex portions 17a of the silicon nitride film 17 positioned over the tops of the corresponding conductive portions 12 are accurately removed, as shown in FIG. 2C, along the triangular convex portions corresponding to each top of the conductive portions 12 so that other portions 17b including the portions covering the upper portions of both edges of the conductive portions 12 remains.

Figure 2D:
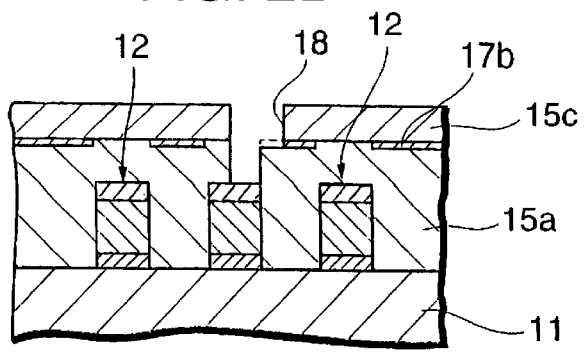

The silicon oxide upper film 15c is provided on the flat silicon oxide lower film 15a including the residual portions 17b of the silicon nitride film 17 as shown in FIG. 2D by a plasma TEOS process in the same manner as the silicon oxide lower film 15a.

Subsequently, a resist (not shown) is formed in the same manner as the first embodiment. A contact hole 18 serving as via hole is formed in the interlayer insulating film 15 (silicon oxide lower film 15a and silicon oxide upper film 15c) by a selective etching treatment using this resist, then a plug conductive portion (not shown) is formed to be embedded in the contact hole 18 in the same manner as the first embodiment.

According to the second embodiment of the invention, since the silicon oxide lower film 15a for embedding the conductive portions 12 therein is formed by a bias CVD process, the convex portions corresponding to the conductive portions 12 can be appropriately formed on the upper surface 16 of the silicon oxide lower film 15a for embedding the conductive portions 12 therein even in a fine design rule of not more than 0.5 μm so that removal portions 17a corresponding to the conductive portions 12 of the silicon nitride film 17 can be precisely formed.

Accordingly, even in a fine design rule of 0.35 μm that is smaller than 0.5 μm, it is possible to prevent the plug conductive portion from reaching the sides of the conductive portions 12 inadvertently or a wiring pattern 13 under the conductive portions 12 (see FIG. 1A) regardless of the presence or absence of error in disposition of the resist 19, thereby surely preventing an accidental trouble such as a short circuit in the circuits, or unwanted increase of capacitance.

The second embodiment explained a case where the interlayer insulating film 15 is formed of a three-layered interconnection structure (silicon oxide lower film 15a, sacrifice film 15b and silicon oxide upper film 15c), the interconnection structure can be varied appropriately, if need be. It is needless to say that various types of method of growing the insulating film other than the plasma TEOS process or bias CVD process can be employed so far as the concave and convex portions corresponding to the conductive portions are formed on the upper surface of the interlayer insulating film during the formation of the interlayer insulating film for embedding the conductive portions 12 therein.

Further, although there was explained a case where the interlayer insulating film 15 is formed of a silicon oxide film and the etching stopper film 17 is formed of a silicon nitride film, the interlayer insulating film 15 and the etching stopper film 17 are not limited to the foregoing, for example, the interlayer insulating film 15 can employ a variety of materials having a large selection rate of an etching rate relative to the insulating film in view of the relation between the interlayer insulating film 15 and the etchant.

According to the invention, it is possible to form the removal portion on the etching stopper film relatively precisely and easily for allowing the application of etching treatment to the portion corresponding to each top of the conductive portions by applying a flattening treatment to the surface of the etching stopper film positioned under the etching mask by polishing or the like, and hence the contact hole can be surely prevented from being deviated from the convex conductive portion owing to the etching treatment by an auxiliary mask operation of the etching stopper film positioned under the upper etching mask regardless of the deviation in the position of the upper etching mask.

Accordingly, it is possible to increase the opening diameter of the contact hole owing to the increase of the opening diameter of the etching mask, and to increase the diameter of the plug conductive portion without entailing an accidental trouble such as a short circuit in the circuits, or unwanted increase of capacitance, whereby an electric resistance of the plug conductive portion is reduced, thereby improving the electric characteristics of the semiconductor device.

What is claimed is:

1. A method of fabricating a semiconductor device, comprising:

forming a first insulating film over and between a plurality of conductive film patterns located over a semiconductor substrate, wherein an upper surface of the first insulating film is defined by convex portions at locations corresponding to the plurality of conductive film patterns and concave portions between the convex portions;

forming an etch-stop film over the upper surface of the first insulating film, wherein the etch-stop film is defined by convex portions at locations corresponding to the convex portions of the upper surface of the first insulating film and concave portions at locations corresponding to the concave portions of the upper surface of the first insulating film;

forming a second insulating film over the convex portions of the etch-stop film and within the concave portions of the etch-stop film;

forming a planarized surface by polishing the second insulating film down to a level of the concave portions of the etch-stop film so as to remove the convex portions of the etch-stop film and expose respective underlying portions of the first insulating film;

forming a third insulating layer over the planarized surface; and forming a contact hole through the third and first insulating layers so as to expose an upper surface of a one of the plurality of conductive film patterns.

2. The method according to claim 1, wherein the first insulating film is a silicon oxide film that is formed by a plasma TEOS process.

3. The method according to claim 2, wherein the third insulating film is a silicon oxide film that is formed by a plasma TEOS process.

4. The method according to claim 3, wherein the second insulating film is a silicon oxide film that is formed by an ozone TEOS process.

5. The method according to claim 1, wherein the first insulating film is a silicon oxide film that is formed by a bias CVD process.

6. The method according to claim 1, wherein the etch-stop film is a silicon nitride film.

7. The method according to claim 1, wherein the polishing is a chemical mechanical polishing.

8. The method according to claim 1, wherein the first, second and third insulating films together constitute an interlayer insulating film in a multilayer interconnection structure.

9. The method according to claim 1, wherein the contact hole is a via hole.

* * * * *